US009243559B2

(12) United States Patent
Young et al.

(10) Patent No.: US 9,243,559 B2
(45) Date of Patent: Jan. 26, 2016

(54) ELECTRICAL HARNESSES

(71) Applicant: ROLLS-ROYCE PLC, London (GB)

(72) Inventors: Richard Andrew Young, Derby (GB); Mark Harrison, Melbourne (GB)

(73) Assignee: ROLLS-ROYCE plc, London (GB)

(*) Notice: Subject to any disclaimer, the term of this patent is extended or adjusted under 35 U.S.C. 154(b) by 579 days.

(21) Appl. No.: 13/659,397

(22) Filed: Oct. 24, 2012

(65) Prior Publication Data
US 2013/0111872 A1    May 9, 2013

(30) Foreign Application Priority Data

Nov. 4, 2011  (GB) .................................. 1119047.7

(51) Int. Cl.
*H01B 7/00*    (2006.01)
*H01B 7/04*    (2006.01)
(Continued)

(52) U.S. Cl.
CPC ............... *F02C 7/00* (2013.01); *B60R 16/0207* (2013.01); *F02C 7/25* (2013.01); *H01B 7/00* (2013.01); *H01B 7/04* (2013.01); *H01B 7/17* (2013.01); *H01B 7/292* (2013.01); *H01B 7/295* (2013.01); *H05K 1/0298* (2013.01); *F05D 2240/91* (2013.01); *H05K 1/0393* (2013.01)

(58) Field of Classification Search
CPC ...... H01B 7/00; H01B 7/0018; H01B 7/0054; H01B 7/04; H01B 7/041–7/046; H01B 7/08; H01B 7/0807–7/0892; H01B 7/102; H01B 7/282; H01B 7/17; H01B 7/29; H01B 7/295; H01B 7/0045; H01B 7/292; B60R 16/0215; B60R 16/0207; H05K 1/0393; H02G 3/32; F02C 7/25
See application file for complete search history.

(56) References Cited

U.S. PATENT DOCUMENTS 4,311,749 A    1/1982  Hiraiwa et al.
5,462,803 A *  10/1995 Wessels ........................ 428/380
(Continued)

FOREIGN PATENT DOCUMENTS

DE    10 2009 004 836 A1   7/2010
EP        0 693 866 A1     1/1996
GB         2463867 A       3/2010

OTHER PUBLICATIONS

Linke-Diesinger Systems of Commercial Turbofan Engines, 2008, Springer-Verlag, pp. XIV, Introduction, 98-101, 104-106.*
Aircraft Materials Fire Test Handbook, 2000, Office of Aviation Research pp. 14-5, 14-7, 11-1, 11-5.*
Horrocks "Advances in Fire Retardant Materials" 2008, Woodhead Publishing, p. 583.*
(Continued)

*Primary Examiner* — Phutthiwat Wongwian
*Assistant Examiner* — William Breazeal
(74) *Attorney, Agent, or Firm* — Oliff PLC

(57) ABSTRACT

An aircraft gas turbine engine has first and second electrical harnesses formed from respective first and second flexible printed circuit boards which each provides a plurality of spaced conductive tracks. The conductive tracks carry signal types which either (i) provide engine control and can cause hazardous engine conditions in the event of their failure, (ii) detect or prevent hazardous conditions of the engine, or (iii) are not of type (i) and/or of type (ii). The first flexible printed circuit board provides all the conductive tracks which carry signals of type (i) or the first flexible printed circuit board provides all the conductive tracks which carry signals of type (ii). The second flexible printed circuit board provides all the remaining conductive tracks. The first electrical harness is fire-resistant for a period of five minutes without any exposure of its conductive tracks so that the conductive tracks can carry their signals.

12 Claims, 4 Drawing Sheets

(51) Int. Cl.
*H01B 7/17* (2006.01)
*H01B 7/295* (2006.01)
*H01B 7/29* (2006.01)
*B60R 16/02* (2006.01)
*F02C 7/25* (2006.01)
*F02C 7/00* (2006.01)
*H05K 1/03* (2006.01)
*H05K 1/02* (2006.01)

(56) References Cited

U.S. PATENT DOCUMENTS

2004/0248434 A1 12/2004 Fujimura

2006/0141852 A1 6/2006 Sato et al.

OTHER PUBLICATIONS

Fire Sleeve and Tape, Jan. 2010 http://www.firesleeveandtape.com/asbestos-replacement-alternative-substitute-tape-rope-fabric-sleeve.html.*
WS Hampshire Inc Mar. 2013 http://catalog.wshampshire.com/Asset/psg_teflon_ptfe.pdf.*
Professional Plastics, Mar. 2008 http://www.professionalplastics.com/TEFLONPTFEGLASSFILLED.*
Apr. 25, 2012 Search Report issued in British Patent Application No. GB1119047.7.
Search Report issued in European Patent Application No. 12 18 9705 dated Jan. 29, 2013.

* cited by examiner (a)

(b)

ELECTRICAL HARNESSES

CROSS-REFERENCE TO RELATED APPLICATIONS

This application is based upon and claims the benefit of priority from British Patent Application Number 1119047.7 filed 4 Nov. 2011, the entire contents of which are incorporated by reference.

FIELD OF THE INVENTION

The present invention relates to electrical harnesses formed from flexible printed circuit boards.

BACKGROUND OF THE INVENTION

With reference to FIG. 1, a ducted fan gas turbine engine generally indicated at 10 has a principal and rotational axis X-X. The engine comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. A nacelle 21 generally surrounds the engine 10 and defines the intake 11, a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines respectively drive the high and intermediate pressure compressors 14, 13 and the fan 12 by suitable interconnecting shafts.

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power and signals to and from the individual electrical components are commonly transmitted along conductors. Conventionally, such conductors may be in the form of wires and cables which are assembled together in a harness. In such a conventional harness, each wire may be surrounded by an insulating sleeve. The connections between the individual components and the conventional harness are made, for example, by multi-pin plug and socket connectors. Similarly, communication between the harness and power, control and signalling circuitry is achieved through a multi-pin connector.

By way of example, FIG. 2 of the accompanying drawings shows a typical gas turbine engine including two conventional wiring harnesses 102, 104, each provided with a respective connector component 106, 108 for connection to circuitry accommodated within the airframe of an aircraft in which the engine is installed.

The harnesses 102, 104 are assembled from individual wires and cables which are held together over at least part of their lengths by suitable sleeving or braiding. Individual wires and cables, for example those indicated at 110, emerge from the sleeving or braiding to terminate at plug or socket connector components 112 for cooperation with complementary socket or plug connector components 114 on, or connected to, the respective electrical components.

FIG. 3 shows examples of (a) single core and (b) twin core wires. The conductive core 120 of the single core wire is surrounded by a braided fireproof insulation 126, while the conductive cores 124 of the twin core wire are surrounded by fireproofing fillers 122. In both cases the wires have an outer sintered PTFE outer jacket 128. The twin core wires also have a nickel-plated copper screen braid 129 between the cores 124 and fillers 126, and the outer jacket 128. All the wires of a conventional harness may contain fire-proofing material of this type.

Each conventional harness 102, 104 therefore comprises a multitude of insulated wires and cables. This makes the conventional harness bulky, heavy and difficult to manipulate. It is desirable to reduce the size and weight of components on gas turbine engines, particularly, for example, gas turbine engines for use on vehicles, such as aircraft.

It is proposed to replace conventional harnesses with flexible printed circuit board harnesses (FPCB harnesses). An example of a portion of a flexible printed circuit board harness 130 is shown in FIGS. 4 to 7. FIG. 4 shows a perspective view of an FPCB harness portion, and FIGS. 5, 6, and 7 show side, top, and cross-sectional views respectively.

The FPCB harness 130 typically comprises a flexible (for example elastically deformable) substrate 140 with conductive tracks 130 laid/formed therein. The FPCB harness 130 may thus be deformable. In the example shown in FIGS. 4 to 7, the FPCB harness 130 extends along a length in the x-direction, a width in the y-direction, and a thickness (or height or depth) in the z-direction. The x direction may be defined as the axial direction of the FPCB harness. Thus, the x-direction (and thus the z-direction) may change along the length of the FPCB harness 20 as the FPCB harness is deformed. The x-y surface(s) may be said to be the major surface(s) of the FPCB harness. In the example shown in FIGS. 4 to 7, the FPCB harness is deformable in the z direction, i.e. in a direction perpendicular to the major surface. FPCB harnesses may be additionally of alternatively deformable about any other direction, and/or may be twisted about any one or more of the x, y, or z directions.

The flexible substrate 150 is typically a dielectric, and the conductive tracks 140, which may be surrounded by the substrate, are typically formed using a suitable conductive material. The conductive tracks 140 may be used to conduct/transfer electrical signals and/or electrical power, for example around a gas turbine engine and/or to/from components of a gas turbine engine. The size (for example the cross-sectional area) and/or the shape of the conductive tracks 140 can depend on the signal to be transmitted through the particular conductive track 140. Thus, the shape and/or size of the individual conductive tracks 140 may or may not be uniform in a FPCB harness 130.

The example shown in FIGS. 4 to 7 has two layers of conductive tracks 140 running through the substrate 150, with three tracks in each layer. However, the number of layers and the number of tracks in the FPCB harness 130 can vary.

Using an FPCB harness to transmit electrical signals and/or power can be advantageous over a conventional harness, for example because of its reduced size, weight and/or complexity.

OBJECTS AND SUMMARY OF THE INVENTION

It would be desirable for electrical harnesses formed from flexible printed circuit boards to provide adequate operational fire resistance, while avoiding excessive additional size, weight and cost.

Accordingly, in a first aspect, the present invention provides an aircraft gas turbine engine having first and second electrical harnesses formed from respective first and second flexible printed circuit boards which each provides a plurality of spaced conductive tracks, wherein:

the conductive tracks are arranged to carry signals of types which either (i) provide engine control and can cause hazardous conditions of the engine in the event of their failure, (ii) detect or prevent hazardous conditions of the engine, or (iii) are not of type (i) and/or of type (ii);

the first flexible printed circuit board provides all the conductive tracks which carry signals of type (i) or the first flexible printed circuit board provides all the conductive tracks which carry signals of type (ii), and the second flexible printed circuit board provides all the remaining conductive tracks; and the first electrical harness is fire-resistant such that it has the capability to withstand the application of heat by a flame, for a period of five minutes without any exposure of its conductive tracks and while retaining the ability of those conductive tracks to carry their signals, the flame having the following characteristics: temperature 1100° C.±80° C., and heat flux density 116 KW/m$^2$±10 KW/m$^2$.

Advantageously, by grouping the conductive tracks such that the fire-resistant first flexible printed circuit board carries all the conductive tracks which carry signals of type (i) or (ii), it is possible to provide adequate overall operational fire resistance while avoiding the bulk, weight and cost of providing excessive and unnecessary fire-proofing to both electrical harnesses. More particularly, even in the event of an engine fire, a pilot should be able to rely on the type (i) or (ii) signals for at least five minutes and therefore take suitable mitigating actions.

In a second aspect, the present invention provides a method of producing first and second electrical harnesses formed from respective first and second flexible printed circuit boards which each provides a plurality of spaced conductive tracks, the tracks being arranged to carry signals of types which, in use, either (i) provide engine control and can cause hazardous conditions of the engine in the event of their failure, (ii) detect or prevent hazardous conditions of the engine, or (iii) are not of type (i) and/or of type (ii), the method including the steps of:

identifying all the conductive tracks which carry signals of type (i) or identifying all the conductive tracks which carry signals of type (ii);

forming the first electrical harness so that the first flexible printed circuit board provides all the conductive tracks thus-identified and the first electrical harness is fire-resistant such that it has the capability to withstand the application of heat by a flame, for a period of five minutes without any exposure of its conductive tracks and while retaining the ability of those conductive tracks to carry their signals, the flame having the following characteristics: temperature 1100° C.±80° C., and heat flux density 116 KW/m$^2$±10 KW/m$^2$; and forming the second flexible printed circuit board so that it provides all the remaining conductive tracks The electrical harnesses produced in the method of second aspect may be the electrical harnesses of the first aspect. Thus, the method may include a subsequent step of installing the electrical harnesses on an aircraft gas turbine engine.

Optional features of the invention will now be set out. These are applicable singly or in any combination with any aspect of the invention.

The fire-resistance capability of the first and/or the second electrical harness is preferably tested in accordance with the test procedure as set out in ISO 2685:1998(E).

Typically, each harness has one or more harness connectors at respective terminating regions of the respective flexible printed circuit board joining the harness to complementary connectors of the engine.

The first harness can be fire-resistant such that it has the capability to withstand the application of heat by a flame, for a period of five minutes without any failure that would create a hazard to the aircraft, the flame having the following characteristics: temperature 1100° C.±80° C., and heat flux density 116 KW/m$^2$±10 KW/m$^2$. That is, the requirements that the harness can withstand the application of heat by the flame without any exposure of its conductive tracks and while retaining the ability of those conductive tracks to carry their signals can be part of a more general requirement to avoid any failure that would create a hazard to the aircraft.

If a signal is of both type (i) and type (ii), then, in general, the track carrying that signal is provided by the first flexible printed circuit board only, and not by the second flexible printed circuit board.

Preferably, the first flexible printed circuit board provides all the conductive tracks which carry signals of type (ii). Typically, there are fewer tracks carrying type (ii) signals than there are tracks carrying type (i) signals. Thus, the first flexible printed circuit board can be smaller, and thereby require less fire-proofing material to meet the fire-resistance standard than would otherwise be the case.

Preferably, the second electrical harness does not have the fire-resistance capability of the first electrical harness. This allows the second harness to have less fire-proofing material, reducing weight, bulk and cost.

However, preferably the second electrical harness does have the capability to withstand the application of heat by a flame, for a period of five minutes without any exposure of its conductive tracks, the flame having the following characteristics: temperature 1100° C.±80° C., and heat flux density 116 KW/m$^2$±10 KW/m$^2$. In this way, even though the ability of those conductive tracks to carry their signals may be lost, sparking from exposed tracks that could restart a fire can be avoided.

Consistent with Eurocae ED-80-DESIGN ASSURANCE GUIDANCE FOR AIRBORNE ELECTRONIC HARDWARE, by "hazardous conditions" we preferably mean conditions that are classified as catastrophic (failure conditions that would prevent continued safe flight and landing) or hazardous/severe-major (failure conditions that would reduce the capability of the aircraft or the ability of the flight crew to cope with adverse operating conditions to the extent that there would be: a large reduction in safety margins or functional capabilities, physical distress or higher workload such that the flight crew could not be relied on to perform their tasks accurately or completely, or adverse effects on occupants including serious or potentially fatal injuries to a small number of those occupants).

The signals of type (i) can include signals that provide engine control and can cause engine overspeed in the event of their failure, such as any one or more of: variable stator vane (VSV) drive command, VSV position feedback, fuel metering valve (FMV) drive command, FMV position feedback, low pressure shaft speed (NL), intermediate pressure shaft speed (NI), high pressure shaft speed (NH), and combustion chamber entry pressure (P30).

Additionally or alternatively, the signals of type (i) can include signals that provide engine control and can cause thrust control malfunction in the event of their failure, such as any one or more of; FMV drive command, FMV position feedback, throttle lever angle, NL, NI, NH, P30, and standard data communications signals (such as ARINC 664).

The signals of type (ii) can include signals that detect or prevent engine overspeed, such as, any one or more of: NL, NI, NH, and overspeed protection valve actuation. Additionally or alternatively, the signals of type (ii) can include signals that detect or prevent thrust control malfunction, such as any one or more of: NL, NI, NH, thrust control malfunction protection valve actuation, and standard data communications signals (such as AMC 664).

Taking the example of engine overspeed, NL, NI, NH signals can both provide engine control and detect overspeed. Thus in this case, if the first flexible printed circuit board provides all the conductive tracks which carry signals of type (ii), not only do fewer tracks need to be in the fire-resistant harness, but advantageously some type (i) signals are also protected. Similar considerations apply to the thrust control malfunction example.

Further optional features of the invention are set out below.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 1:
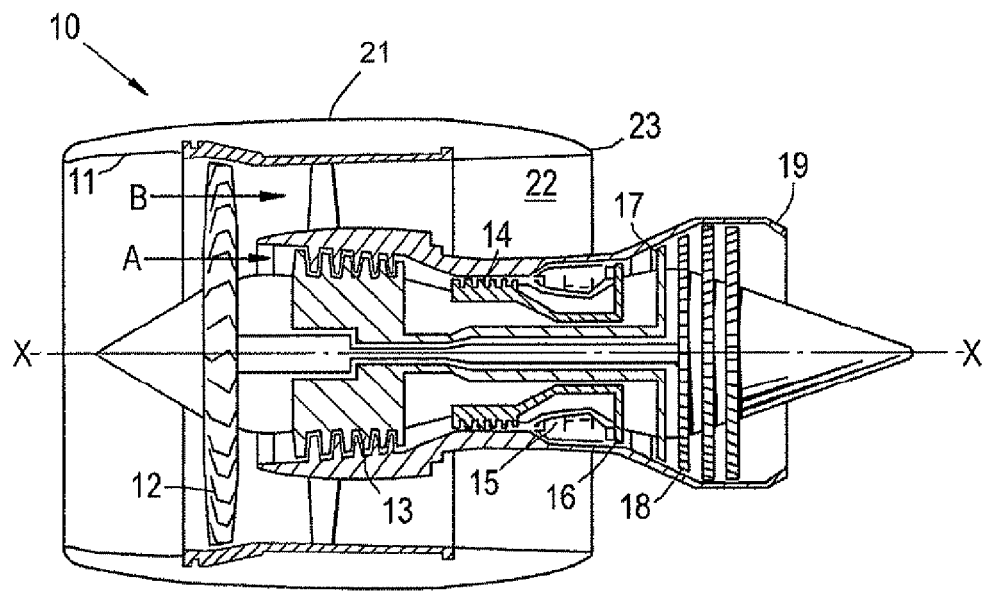
FIG. 1 shows a schematic longitudinal cross-sectional view through a ducted fan gas turbine engine.
Figure 2:
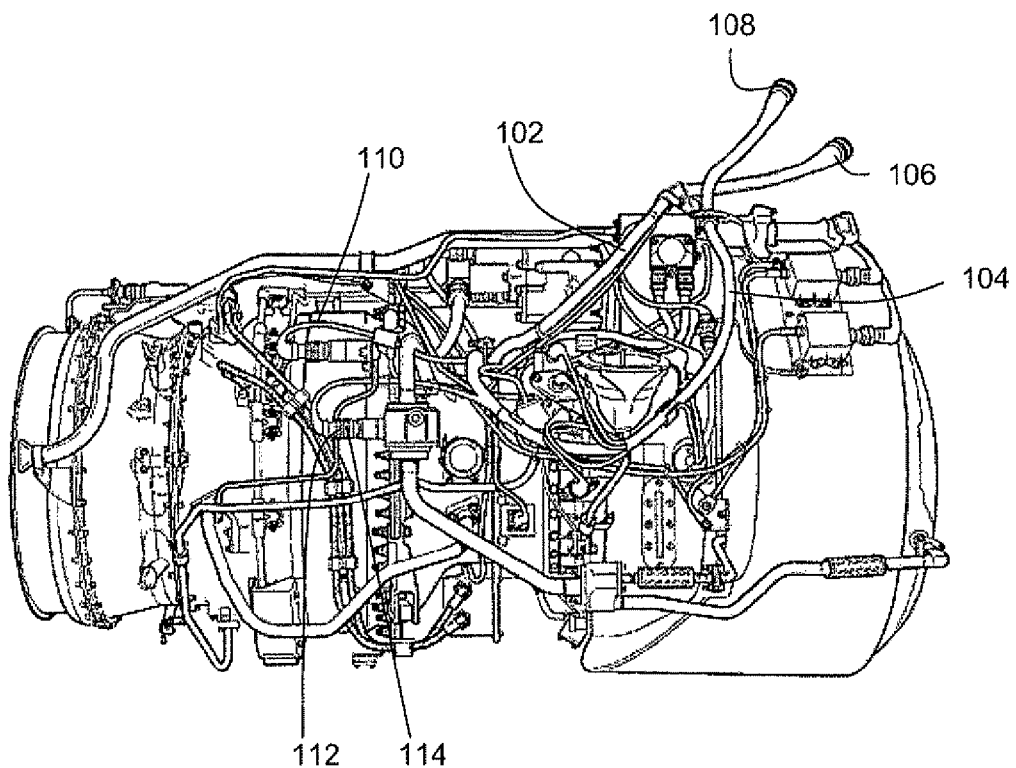
FIG. 2 shows a gas turbine engine with a conventional harness.
Figure 3:
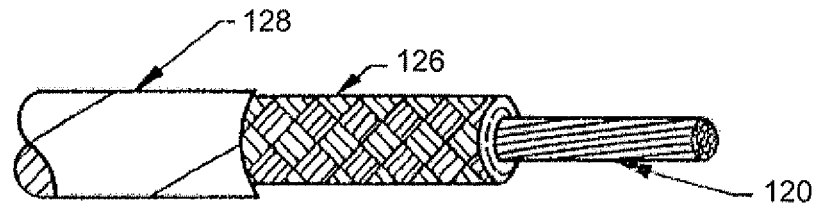
FIG. 3 shows examples of (a) single core and (b) twin core wires.
Figure 3:
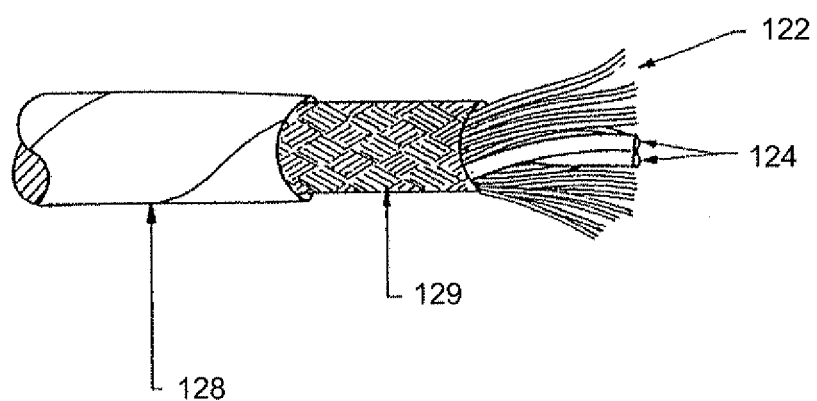
Figure 4:
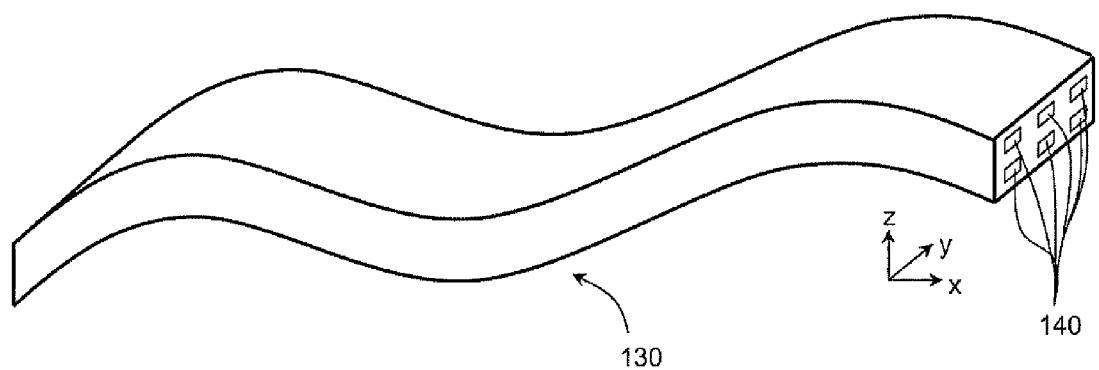
FIG. 4 shows a schematic perspective view of a portion of a flexible printed circuit board harness.
Figure 5:
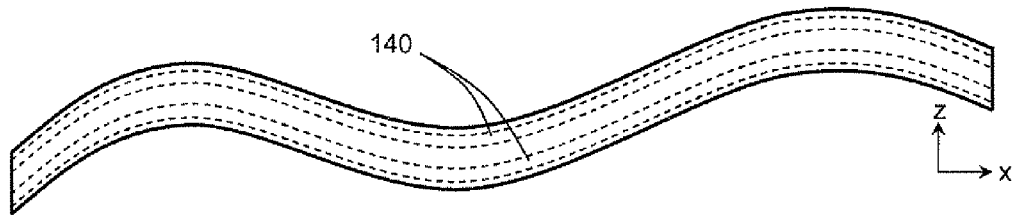
FIG. 5 shows a side view of the flexible printed circuit board harness of FIG. 4.
Figure 6:
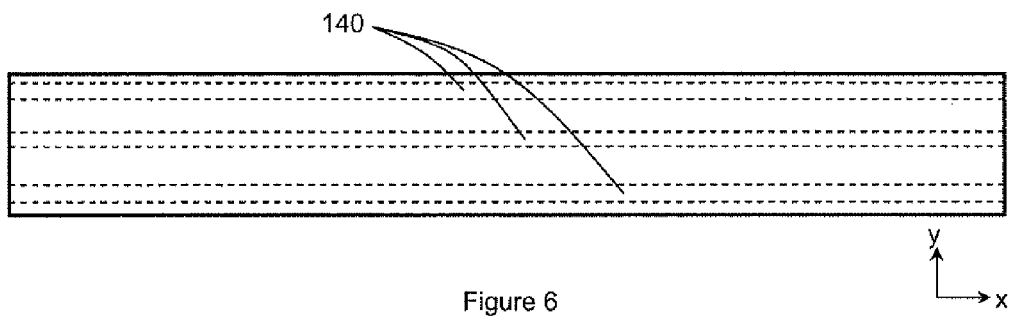
FIG. 6 shows a top view of the flexible printed circuit board harness of FIG. 4.
Figure 7:
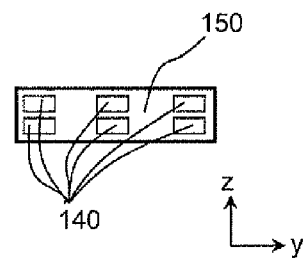
FIG. 7 shows a transverse cross-sectional view of the flexible printed circuit board harness of FIG. 4.
Figure 8:
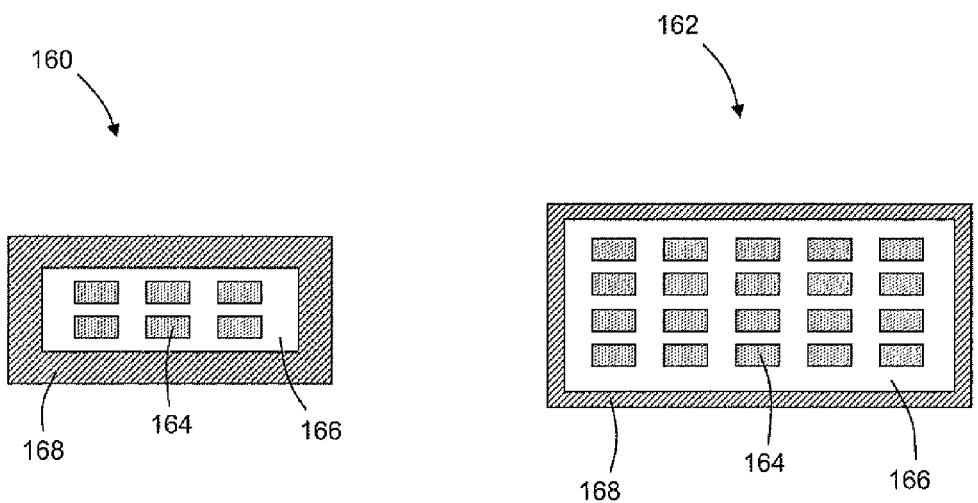
FIG. 8 shows transverse cross-sectional views of first and second electrical harnesses according to an embodiment of the present invention.

FIG. 8 shows transverse cross-sectional views of first 160 and second 162 electrical harnesses according to an embodiment of the present invention, the harnesses being for installation on an aircraft gas turbine engine, for example a turbofan, turbojet, turboprop, open-rotor gas or other type of aircraft turbine engine.

Each harness has a respective flexible printed circuit board, in which a plurality of conductive tracks 164 are grouped into layers and embedded in flexible dielectric material 166, such as polyimide.

Surrounding each flexible printed circuit board is a layer of fire-proofing material 168, such asa FASTBLOCK™ compound available from Esterline Technologies, intumescing paint/sheet, or a ceramic coating. The thickness of fire-proofing material is greater in the first electrical harness 160 than in the second electrical harness 162.

The conductive tracks 164 of the first electrical harness 160 only carry the signals: NL, NI, overspeed protection valve actuation, thrust control malfunction protection valve actuation and ARINC 664 signals. These signals detect or prevent engine overspeed and thrust control malfunction.

The conductive tracks 164 of the second electrical harness 162 carry the signals: VSV drive command, VSV position feedback, FMV drive command, FMV position feedback and optionally P30. These signals (along with the NL, NI and ARINC 664 signals of the first electrical harness 160) provide engine control and can cause engine overspeed and thrust control malfunction in the event of their failure. The other conductive tracks of the second electrical harness carry signals which neither detect or prevent hazardous conditions of the engine, nor provide engine control and can cause hazardous conditions of the engine in the event of their failure.

The shaft speed signals NL and NI are involved in both engine control and the protection of the engine against hazardous overspeed, but there are a sufficient number of these signals such that single failures during normal engine operation cannot result in unprotected overspeed. If multiple speed signals fail during a fire, such that they are erroneously low, the engine will try to put more fuel in to achieve a set, higher, demand. However, because of the speed signal failure, the speed signals do not show that the real speed of the engine is accelerating, potentially leading to a hazardous overspeed.

ARINC 664 signals are generally used to communicate commands and feedbacks from the airframe, such as the throttle demand from the cockpit. If this signal were, hypothetically, to fail under a fire condition it could give commands to the engine which the engine could interpret as real but would in fact be false. Such conditions can be hazardous. For example, if two engines are commanded to be at idle, but one—due to a failure—went to full thrust, the resulting asymmetric thrust would be a hazard to the aircraft.

The layer of fire-proofing material 168 of the first electrical harness 160 is thicker than that of the second electrical harness 162 so that the first electrical harness has the capability to withstand the application of heat by a flame, for a period of five minutes without any exposure of its conductive tracks 164 and while retaining the ability of those conductive tracks to carry their signals, the flame having the following characteristics: temperature 1100° C.±80° C., and heat flux density 116 KW/m$^2$±10 KW/m$^2$. The thinner layer of fire-proofing material 168 of the second electrical harness 162 nonetheless gives the second electrical harness the capability to withstand the application of heat by a flame, for a period of five minutes without any exposure of its conductive tracks, the flame having the following characteristics: temperature 1100° C.±80° C., and heat flux density 116 KW/m$^2$±10 KW/m$^2$.

In the event of an engine fire, the pilot can rely on the signals detecting or preventing engine overspeed and thrust control malfunction carried by the tracks 164 of the first electrical harness 160 for at least five minutes, and can thus take appropriate mitigating actions in this period. Although the signals providing engine control carried by the tracks 164 of the second electrical harness 162 cannot be relied on in this period, as these tracks should not be exposed they should be unable to cause a spark that reignites the fire.

By providing the thicker layer of fire-proofing material 168 only on the first electrical harness 160, rather than on both harnesses, significant size, weight and cost savings can be achieved while maintaining appropriate engine safety levels.

Figure 9:
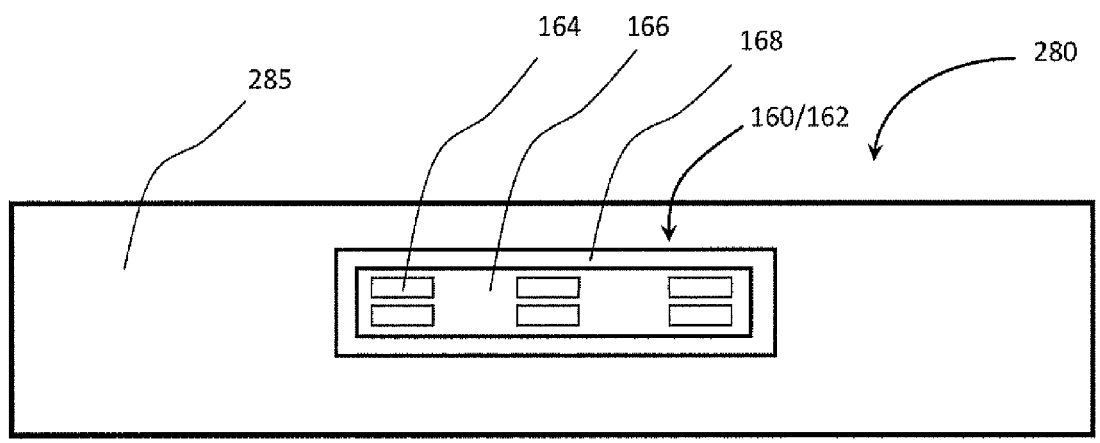
FIG. 9 shows a diagrammatic representation of an electrical harness embedded in a rigid material.

At least a part of one or both of the first electrical harness 160 or the second electrical harness 162 may be embedded in a rigid material 285, as shown in FIG. 9 by way of example. For example, along at least a part of its length, the flexible printed circuit board forming one or both of the electrical harnesses 10, 162 may be fixed inside a rigid material 285 to form a rigid structure 280, which may be referred to as a rigid raft 280. Thus, one or both of the electrical harnesses 160, 162 may comprise a rigid structure through which the respective flexible printed circuit board runs. Such a rigid structure may be readily mounted on or fixed to another component, for example a gas turbine engine.

The rigid material 285 may be, for example, a composite material of fibre and filler, such as carbon fibre. Any suitable method may be used to manufacture such a rigid structure 280 such as, for example, placing the flexible printed circuit board between flexible layers of a composite material (or "laying-up" the flexible composite material), and then moulding to the desired shape and treating (for example heat and/or pressure treating) to form a rigid composite structure.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various, changes to the described embodiments may be made without departing from the spirit and scope of the invention.

All references referred to above are hereby incorporated by reference.

We claim:

1. An aircraft gas turbine engine having first and second electrical harnesses formed from respective first and second flexible printed circuit boards which each provides a plurality of conductive tracks, wherein the conductive tracks are spaced, wherein:
   the conductive tracks are arranged to carry signals of types which either (i) provide engine control and can cause hazardous conditions of the aircraft gas turbine engine in the event of their failure, (ii) detect or prevent hazardous conditions of the aircraft gas turbine engine, or (iii) are not of type (i) or of type (ii) or both of type (i) and type (ii);
   the first flexible printed circuit board provides all conductive tracks which carry signals of type (i) or the first flexible printed circuit board provides all conductive tracks which carry signals of type (ii), and the second flexible printed circuit board provides all remaining conductive tracks; and
   the first electrical harness is fire-resistant such that it is capable of withstanding application of heat by a first flame, for a period of five minutes without any exposure of its conductive tracks and while retaining the ability of its conductive tracks to carry signals, the first flame having a first temperature of 1100° C.±80° C., and a first heat flux density of 116 KW/m²±10 KW/m², wherein the second electrical harness has a lower fire-resistance capability than that of the first electrical harness along an entire length of the second electrical harness.

2. The aircraft gas turbine engine according to claim 1, wherein the first flexible printed circuit board provides all conductive tracks which carry signals of type (ii).

3. The aircraft gas turbine engine according to claim 1 wherein second electrical harness is capable of withstanding the application of heat by a second flame, for a period of five minutes without any exposure of its conductive tracks, the second flame having a second temperature of 100° C.±80° C., and a second heat flux density of 116 KW/m²±10 KW/m².

4. The aircraft gas turbine engine according to claim 1, wherein the signals of type (i) include signals that provide engine control and cause engine overspeed and/or thrust control malfunction in the event of their failure.

5. The aircraft gas turbine engine according to claim 1, wherein the signals of type (ii) include signals that detect or prevent engine overspeed and/or thrust control malfunction.

6. The aircraft gas turbine engine according to claim 1, wherein at least a part of at least one of the first and second electrical harnesses is embedded in a rigid material.

7. The aircraft gas turbine engine according to claim 6, wherein the rigid material is a rigid composite material.

8. A method of producing first and second electrical harnesses of an aircraft gas turbine engine, the first and second electrical harnesses being formed from respective first and second flexible printed circuit boards which each provides a plurality conductive tracks, wherein the conductive tracks are spaced, the conductive tracks being arranged to carry signal of types which, in use, either (i) provide engine control and can cause hazardous conditions of the aircraft gas turbine engine in the event of their failure, (ii) detect or prevent hazardous conditions of the aircraft gas turbine engine, or (iii) are not of type (i) or of type (ii) or of both type (i) and type (ii), the method including the steps of:
   identifying all conductive tracks which carry signals of type (i) or identifying all conductive tracks which carry signals of type (ii); forming the first electrical harness so that the first flexible printed circuit board provides all conductive tracks thus-identified and the first electrical harness is fire-resistant such that it is capable of withstanding the application of heat by a first flame, for a period of five minutes without any exposure of its conductive tracks and while retaining the ability of its conductive tracks to carry signals, the first flame having a first temperature of 1100° C.±80° C., and a first heat flux density of 116 KW/m²±10 KW/m²; and forming the second flexible printed circuit board so that it provides all remaining conductive tracks, wherein the second electrical harness is formed such that is has a lower fire-resistance capability than that of the first electrical harness along an entire length of the second electrical harness.

9. The method according to claim 8, wherein all conductive tracks which carry signals of type (ii) are identified.

10. The method according to claim 8, wherein the second electrical harness is formed such that it is capable of withstanding the application of heat by a second flame, for a period of five minutes without any exposure of its conductive tracks, the second flame having a second temperature of 1100° C.±80° C., and a second heat flux density of 116 KW/m²±10 KW/m².

11. The method according to claim 8, wherein the signals of type (i) include signals that provide engine control and cause engine overspeed and/or thrust control malfunction in the event of their failure.

12. The method according to claim 8, wherein the signals of type (ii) include signals that detect or prevent engine overspeed and/or thrust control malfunction.

\* \* \* \* \*